(12) United States Patent
Sit et al.

(10) Patent No.: US 7,126,509 B2
(45) Date of Patent: Oct. 24, 2006

(54) MICROPOWER LOGARITHMIC ANALOG TO DIGITAL CONVERSION SYSTEM AND METHOD WITH OFFSET AND TEMPERATURE COMPENSATION

(75) Inventors: Ji-Jon Sit, Cambridge, MA (US); Rahul Sarpeshkar, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/884,106

(22) Filed: Jul. 2, 2004

(65) Prior Publication Data

US 2005/0024245 A1 Feb. 3, 2005

Related U.S. Application Data

(60) Provisional application No. 60/488,149, filed on Jul. 17, 2003.

(51) Int. Cl.
*H03M 1/06* (2006.01)
(52) U.S. Cl. .................................. 341/119; 341/155
(58) Field of Classification Search ................ 341/119, 341/120, 155, 143; 703/4; 327/75
See application file for complete search history.

(56) References Cited

U.S. PATENT DOCUMENTS

| | | | | |
|---|---|---|---|---|
| 4,229,730 A | * | 10/1980 | Huntington | ................ 341/128 |
| 5,081,378 A | * | 1/1992 | Watanabe | ................... 327/350 |
| 5,294,791 A | * | 3/1994 | Pahr | .......................... 250/548 |
| 5,589,791 A | * | 12/1996 | Gilbert | ........................ 327/359 |
| 5,592,168 A | | 1/1997 | Liao | |
| 5,652,586 A | | 7/1997 | Chuh et al. | |
| 5,699,004 A | | 12/1997 | Picciotto | |
| 5,729,230 A | * | 3/1998 | Jensen et al. | ................ 341/143 |
| 5,936,433 A | * | 8/1999 | Holloway | ..................... 327/75 |
| 5,936,466 A | | 8/1999 | Andoh et al. | |
| 5,959,871 A | * | 9/1999 | Pierzchala et al. | .............. 703/4 |
| 6,147,550 A | * | 11/2000 | Holloway | .................... 327/544 |
| 6,184,812 B1 | * | 2/2001 | Younis et al. | ................ 341/143 |
| 6,392,582 B1 | | 5/2002 | Nakamura | |
| 6,396,430 B1 | | 5/2002 | Li | |
| 6,452,531 B1 | * | 9/2002 | Miller et al. | ................. 341/172 |
| 6,693,572 B1 | * | 2/2004 | Oliaei et al. | ................. 341/143 |
| 6,750,796 B1 | * | 6/2004 | Holloway et al. | .......... 341/143 |
| 2002/0118182 A1 | * | 8/2002 | Weindorf | |

OTHER PUBLICATIONS

Analog Devices, "160 dB Range (100pA-10mA) Logarithmic Converter", 2002, month is unknown.*
"A Micropower Logarithmic A/D with Offset and Temperature Compensation," Sit et al., *IEEE J. of Solid-State Circuits*, vol. 39, n. 2 (Feb. 2004).
"Logarithmic Analog-to-Digital Converters: A Survey," Cantarano et al., *IEEE Transactions on Instrumentation and Measurement*, vol. IM-22, n. 3 (Sep. 1, 1973).
"A Low-Power Analog Logarithmic Map Circuit with Offset and Temperature Compensation for Use in Bionic Ears," Sit, *Internet Article*, XP002313184 (Sep. 2002).

(Continued)

*Primary Examiner*—Jean Bruner Jeanglaude
(74) *Attorney, Agent, or Firm*—Gauthier & Connors LLP

(57) ABSTRACT

A logarithmic analog-to-digital converter system is disclosed. The system includes a transconductor for receiving an input signal and for producing a transconductor output signal at a transconductor output, a logarithmic circuit unit that is coupled to an input of the transconductor, a comparator amplifier for receiving the transconductor output signal and for producing a comparator amplifier output signal at a comparator amplifier output, and an integrating capacitor coupled to the transconductor output signal.

28 Claims, 10 Drawing Sheets

OTHER PUBLICATIONS

"CMOS Low-Power Analog Circuit Design," Enz et al., *Conference Proceedings Article*, p. 79-133 (1996), no month.

"The Integrated A/D Converters," Anonymous, *Internet Article* XP002313185 (1999), no month.

"A Low-Power Wide-Dynamic-Range Analog VLSI Cochlea," Sarpeshkar et al., *Analog Integrated Circuits and Signal Processing* vol. 16, pp. 245-274 (Aug. 1998).

"Micropower Log-Domain Filter for Electronic Cochlea," Toumazou et al., *Electronics Letters*, vol. 30, n. 22 (Oct. 27, 1994).

"An Analog VLSI Cochlea with New Transconductance Amplifiers and Nonlinear Gain Control," Sarpeshkar et al., *IEEE International Symposium on Circuits and Systems*, vol. 3, pp. 292-295 (May 12, 1996).

\* cited by examiner

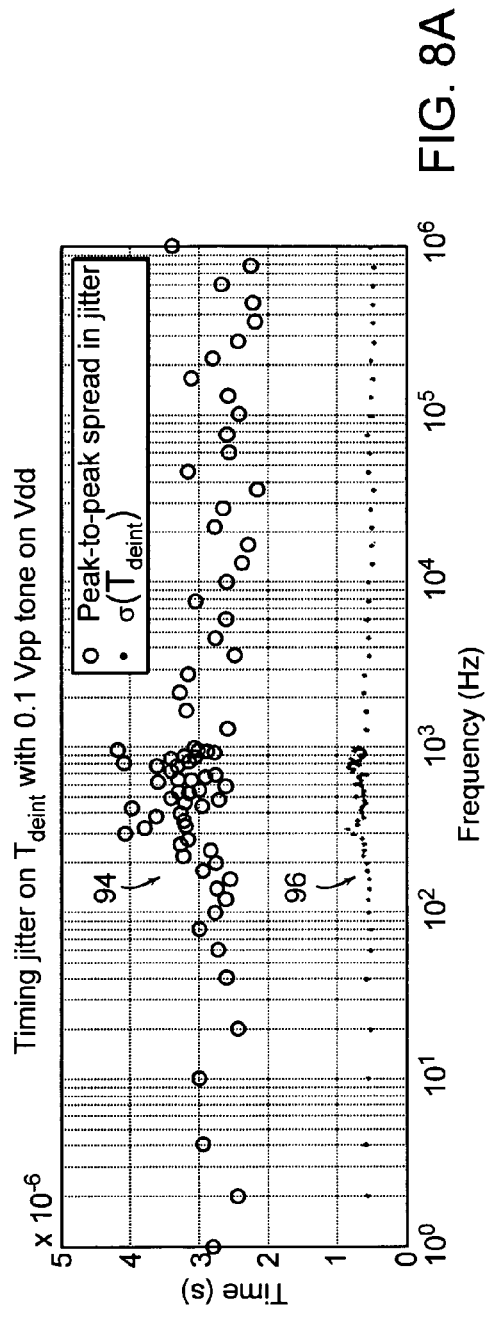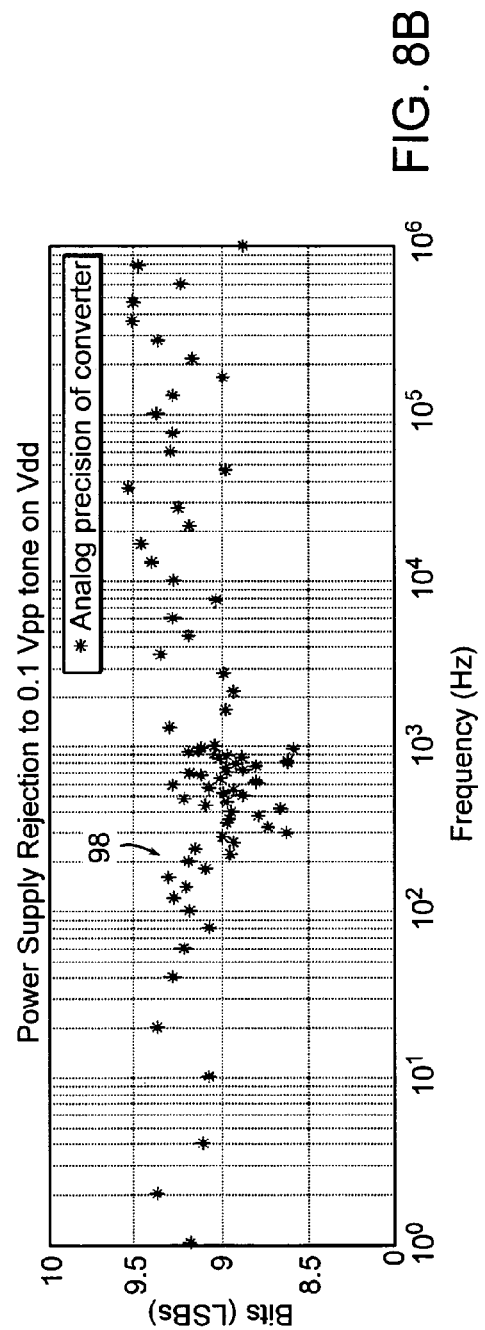

MICROPOWER LOGARITHMIC ANALOG TO DIGITAL CONVERSION SYSTEM AND METHOD WITH OFFSET AND TEMPERATURE COMPENSATION

PRIORITY

This application claims priority to U.S. Provisional Application Ser. No. 60/488,149 filed Jul. 17, 2003.

BACKGROUND OF THE INVENTION

The invention generally relates to systems and methods for providing logarithmic analog-to-digital conversion, and relates in particular to circuits for providing logarithmic analog-to-digital conversion for auditory enhancement.

Cochlear implants (or bionic ears) have been implanted in tens of thousands of people worldwide. Cochlear implants use a surgically implanted array of electrodes to stimulate the auditory nerve, which restores a measure of hearing to the deaf. The cochlear implant functions as a surrogate middle and inner ear, performing the same chain of signal transduction from sound waves to electrical impulses as in the biological cochlea. FIG. 1 shows the signal-processing chain of a typical cochlear implant that includes a preamplifier 10 that receives an input signal via a microphone 12. The preamplifier 10 provides an amplifier output signal to a plurality of band pass filters 14a–14c. The outputs of the band pass filters 14a–14c are provided to a plurality of envelope detectors 16a–16c respectively, and the outputs of the envelope detectors 16a–16c are provided to a plurality of logarithmic map units 18a–18c respectively. The outputs of the logarithmic map units 18a–18c are provided to a plurality of electrodes 20a–20c respectively as shown. During operation, each band pass filter 14a–14c passes a different band (e.g., low, mid, high). The envelope detectors are used to identify envelope information, and the logarithmic map units are used to provide logarithmic compression of the signal, which is conventionally employed just prior to nervous stimulation. Such compression is useful because theory and experiments suggest that acoustic amplitudes are log-compressed into electrical amplitudes by the cochlea. In other words, there is believed to be a linear relationship between sound intensity in dB sound pressure level (SPL) and electrical stimulation intensity in $\mu A$. A circuit that performs logarithmic compression, therefore, is useful in cochlear implant processors.

Logarithmic compression is also inherent to cepstral speech recognition, since a logarithmic function allows the excitation signal in speech to be subtracted from the effect of filtering by the vocal tract. Many speech-recognition front-ends are therefore designed to produce output bits that represent log-spectral magnitudes of a microphone input signal. A logarithmic A/D logarithmically compresses the current input from an envelope detector into a digital output code. Consequently, a low-power logarithmic A/D is very useful in portable speech-recognition front-ends and bionic ears.

Conventional cochlear implants and speech-recognition front-ends typically employ an analog-to-digital (A/D) conversion, followed by a digital signal processor (DSP) to perform the necessary signal processing. A DSP, however, is costly in power when compared with analog processing schemes.

There is a need for a logarithmic A/D system that provides significant power savings for fully-implanted cochlear implants or speech-recognition-front-ends. There is further a need for a logarithmic A/D (logmap) that exploits subthreshold CMOS technology to compute a logarithm in a fraction of the power of DSP implementations.

SUMMARY

The invention provides a micropower logarithmic analog-to-digital converter system. The system includes a transconductor for receiving an input signal and for producing a transconductor output signal at a transconductor output, a logarithmic circuit unit that is coupled to an input of the transconductor, a comparator amplifier for receiving the transconductor output signal and for producing a comparator amplifier output signal at a comparator amplifier output, and an integrating capacitor coupled to the transconductor output signal. In further embodiments, the system includes a de-integrating input switch for selectively applying a de-integrating current to the transconductor output in certain embodiments. In further embodiment, the system includes a first feedback loop coupling the transconductor output to an input of the transconductor, and a second feedback loop coupling the comparator amplifier output to an input to the comparator amplifier. In further embodiments, the system provides automatic offset adjustment and auto-zeroing.

In further embodiments, a logarithmic analog-to-digital converter system of the invention includes a transconductor for receiving an input signal and for producing a transconductor output signal at a transconductor output, a logarithmic circuit unit that is coupled to an input of the transconductor, a first feedback loop coupling the transconductor output to an input of the transconductor, a comparator amplifier for receiving the transconductor output signal and for producing a comparator amplifier output signal at a comparator amplifier output, a second feedback loop coupling the comparator amplifier output to an input to the comparator amplifier, and an integrating capacitor coupled to the transconductor output signal.

In further embodiments, the invention provides a logarithmic analog-to-digital converter system including a transconductor for receiving an input signal and for producing a transconductor output signal at a transconductor output, a first feedback loop coupling the transconductor output to an input of the transconductor, a comparator amplifier for receiving the transconductor output signal and for producing a comparator amplifier output signal at a comparator amplifier output, a second feedback loop coupling the comparator amplifier output to an input to the comparator amplifier, and an integrating capacitor coupled to the transconductor output signal.

In still further embodiments, the invention provides a method of providing a logarithmic analog-to-digital conversion. The method includes the steps of receiving a transconductor input signal and producing a transconductor output signal at a transconductor output, coupling the transconductor output to an input of the transconductor, receiving the transconductor output signal at a comparator amplifier input and producing a comparator amplifier output signal at a comparator amplifier output, coupling the comparator amplifier output to an input of the comparator amplifier, integrating the transconductor input signal for a first period of time, and de-integrating the transconductor output signal for a second period of time

BRIEF DESCRIPTION OF THE DRAWING

The following description may be further understood with reference to the accompanying drawings in which:

FIGS. 8A and 8B show illustrative diagrammatic views of power supply rejection of a logmap analog-to-digital conversion system in accordance with an embodiment of the invention;

The drawings are shown for illustrative purposes only.

DETAILED DESCRIPTION OF THE ILLUSTRATED EMBODIMENTS

The invention provides a micropower logarithmic A/D with offset and temperature compensation in accordance with various embodiments. Logarithmic circuits are useful in many applications that require nonlinear signal compression, such as in speech recognition front-ends and cochlear implants. In accordance with certain embodiments, a logarithmic current-input A/D converter with temperature compensation and automatic offset calibration is provided that employs a diode to compute the logarithm, a wide linear range transconductor to perform voltage-to-current conversion, and a dual-slope, auto-zeroing topology with 60 dB of dynamic range for sampling the envelope of speech signals. The temperature dependence of the logarithm inherent in a diode implementation is automatically cancelled in certain embodiments. Experimental results from a 1.5 µm, 3V BiCMOS process show that the converter achieves a temperature stability lower than 150 ppm/° C. from 12° C. to 42° C., and consumes only 3 µW of power when sampling at 300 Hz. At this level of power consumption, the design is thermal-noise limited to 8 bits of precision. This level of precision is adequate for deaf patients and for speech recognition front-ends. The power consumption is almost two orders of magnitude lower than state-of-the-art DSP implementations, and the use of a local feedback topology achieves a 2½-bit improvement over conventional dual-slope designs.

Figure 1:
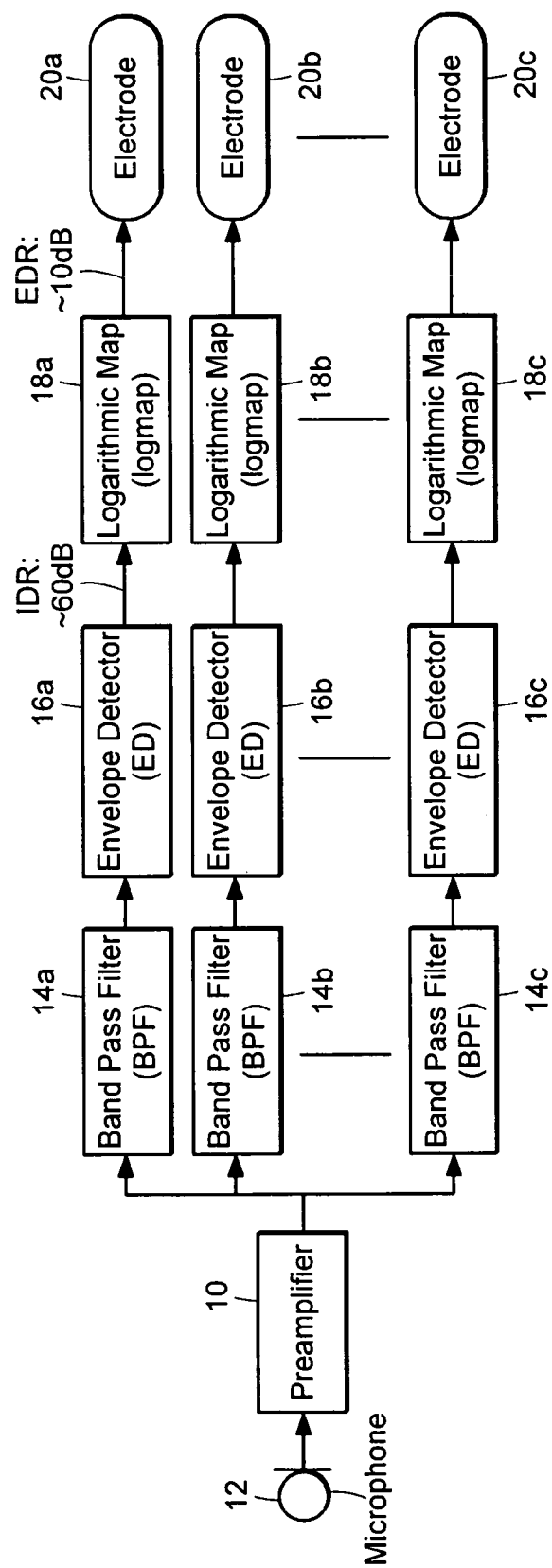
FIG. 1 shows an illustrative diagrammatic schematic view of a signal processing system for a cochlear implant of the prior art.

It is also desirable that the logmap have an input dynamic range of at least 60 dB, to handle the range within which most of normal speech will lie. This also allows the logmap to accommodate the internal dynamic range (IDR) of typical cochlear implants, which is around 60 dB, as denoted in FIG. 1. The IDR of a cochlear implant must be fit onto the limited electrical dynamic range (EDR) of a deaf patient's auditory nerve fibers, which may range from 10 dB–20 dB. The threshold of sensation however, may vary by an additional 40 dB between patients or even between electrodes (for example, the minimum detectable electrode current may vary from 2 µA to 200 µA). The absolute level of output current therefore, may have to vary by as much as 60 dB, which is impractical to generate directly from sub-threshold analog currents. Current cochlear implants already make use of a D/A to construct stimulation waveforms in the electrodes. It is desirable therefore, for a fully analog cochlear implant processor to generate output bits that can interface to a back-end D/A stimulator. The D/A stimulator may then be programmed to perform the requisite offset and scaling for each electrode.

There are additional benefits to an A/D/A strategy beyond the programmability and flexibility conferred from digitization. First, a DSP can still be swapped in place of the analog cochlear implant processor, with both systems sharing the same D/A stimulator. Thus both signal processors may be made available as alternatives for the patient, and also as backups for each other in case of failure. Second, this strategy confers a benefit in terms of power consumption and noise by creating a clean separation between the low-power and high-power circuits. As the large stimulation currents are confined by the D/A to be as late in the signal processing chain as possible, this not only conserves power, but also minimizes any noise coupled back from the output. Thus it makes sense for the final stage of an analog cochlear implant to produce log-scaled output bits, which is no different from a cepstral speech recognition frond end (SRFE).

It is expected that a precision of 8 bits should be sufficient for SRFE's, while a 6-bit precision should suffice for cochlear implants. This is because normal hearing listeners can detect about 200 discriminable intensity steps within their dynamic range, while implant patients can only discriminate between 8–50 intensity steps. While an 8-bit design is presented below, precision may be traded off for a quadratic increase in sampling rate at the same level of analog power. This relationship may be derived from the precision of the A/D being limited by thermal-noise.

In accordance with a system of the invention, each logmap is designed to take in a current-mode input from an envelope detector. It must also have a bandwidth of at least 300 Hz to handle the envelope variation in speech. Current cochlear implants implement intentional low-pass cutoffs between 35 and 300 Hz, since the envelope of speech is believed to vary slowly, no faster than a few 100 Hz. To be compatible however, with higher stimulation rates up to 2 kHz or higher (where some implant patients have been shown to do better), an input bandwidth of up to 5 kHz may be desirable. For this 300 Hz converter, higher stimulation rates at the same level of precision require a linear increase in both analog and digital power. Higher stimulation rates at constant power may be attained by lowering precision.

A logarithm may conventionally be computed by a DSP in about 1 MIP. Even with state-of-the-art DSPs such as the micropower C55x series DSP sold by Texas Instruments of Dallas Tex., a logarithm will require about 250 μW to compute. Converters in accordance with various embodiments of the invention may consume only 1 μW in the analog section and 2 μW for the digital control.

Power supply noise should also not adversely affect performance in the analog circuit. The A/D must perform in noisy environments, and should therefore employ some minimum level of power supply rejection. Also, although a fully-implanted cochlear implant may have a well-regulated external temperature, internal temperature gradients may be set up in the device by neighboring high-power circuits in certain embodiments. Furthermore, a sub-threshold circuit may be sensitive to even small temperature variations, because sub-threshold currents vary exponentially with temperature. Fully-implanted cochlear implants and portable SRFEs should be expected to be exposed to changing thermal environments. It is important therefore, for the logmap to have some built-in immunity to temperature fluctuations.

Systems in accordance with certain embodiments of the invention employ a dual-slope integrator to perform the logarithmic A/D conversion. Both cochlear implants and SRFE's break down the input spectrum into 8–32 channels. A complete cochlear implant processor or SRFE will therefore require 8–32 logmaps to be operating in parallel. The use of an integrating A/D topology allows a single clocking waveform and counter to be shared between the logmaps to implement quantization. As the clocking waveform is the highest frequency signal on chip, the ability to amortize its cost in terms of power and area is a tremendous advantage for highly parallel systems such as cochlear implants and SRFEs.

Also, the sensitive temperature dependence of sub-threshold bias currents is automatically cancelled in a dual-slope topology. If the charging current and discharging current in the topology are derived from a single bias current, any temperature dependence in that bias current gets divided out in the conversion. A dual-slope A/D topology, therefore, has inherent immunity to component drift because component values such as capacitance serve as intermediate variables that cancel out in the final answer. This is advantageous in cochlear implants and SRFEs, which are intended for long-term usage, and need to preserve their accuracy over long periods of time. The experimentally measured precision of certain systems in accordance with various embodiments of the invention is limited only by thermal noise, which is fundamental and unavoidable. The precision of DACs such as in successive approximation topologies, or capacitor matching such as in pipelined topologies does not matter in dual slope topologies. Although matching problems may be solved through calibration, such solutions require more complexity and area.

Further, other logarithmic A/D topologies like those based on Σ-Δ or pipelined architectures have a level of complexity and power consumption that is too high to be appropriate for cochlear implant or SRFE systems. The dual-slope topology has a small transistor count and is easily implemented in the sub-threshold CMOS regime. It can be scaled in area and power to meet multiple-channel requirements for practical cochlear implant and SRFE processors.

An additional benefit of the dual-slope converter is its performance in the presence of high-frequency noise. The dual-slope converter performs boxcar integration on its input, and has the effect of applying a sinc filter in the frequency domain. The sinc function acts as an effective anti-aliasing filter, as it has a −3 db first-order rolloff past $0.44/T_{int}$ (where $T_{int}$ is the time of integration), and also introduces frequency nulls at multiples of $1/T_{int}$. The input needs to be Nyquist rate-limited to frequencies below $0.5/T_s$, where $T_s$ is the sampling period, and $T_s > T_{int}$. Any distortion from the sinc is therefore small in the passband. Since the envelope detector prior to the logmap performs lowpass filtering on its input, and the dual slope has built-in sinc filtering, there is little need to add another explicit anti-aliasing filter before the dual-slope converter.

A simplified circuit implementation of a conventional dual-slope converter may include a wide-linear-range operational transconductance amplifier (WLR OTA) and integrating capacitor $C_{int}$, to serve as the integrator, another amplifier to serve as the comparator (a standard 5-transistor OTA suffices), and an offset storage capacitor $C_{az}$. The latter three components are tied in a global feedback loop when the auto-zeroing switch AZ is closed. The A/D conversion has three phases of operation: During phase I, switch AZ is closed, so the offset of the WLR is stored on $C_{az}$ and the offset of the comparator is stored on $C_{int}$. In phase II, AZ is opened and the WLR charges up $C_{int}$ with a current $I_{int}$ proportional to $V_{in}$, for a fixed time $T_{int}$. $V_{o1}$ will hence reach a final voltage $V_f$, proportional to $V_{in}$. Finally in phase III, the WLR discharges $C_{int}$ back down to ground, with a fixed current $I_{deint}$. The time it takes to discharge, called $T_{deint}$, is proportional to $V_f$. This time is counted with a clock and the clock count provides the digital measure of $V_{in}$.

This auto-zeroing algorithm found in conventional dual slope architectures allows one to reduce the DC offset in each amplifier by the loop gain of the feedback loop. Another property of the dual-slope strategy stems from the ratiometric dependence of $T_{deint}$ on $I_{int}/I_{deint}$, as shown in Equation (1).

$$V_f = \frac{I_{int}}{C_{int}} \times T_{int} \quad (I \to V \text{ transformation}) \tag{1}$$

$$T_{deint} = \frac{V_f}{I_{deint}/C_{int}} \quad (V \to t \text{ transformation})$$

$$= \frac{I_{int}}{I_{deint}} \times T_{int}$$

$T_{deint}$ is thus the product of a current-to-time conversion, computed through the intermediate voltage $V_f$. This relation, however, may be derived more simply if we note that no net charge was added to the capacitor over the conversion cycle, since $C_{int}$ starts and ends in the same state. Then by conservation of charge, the relationships of Equation (2) may be obtained.

$$Q_{added} = Q_{removed} \tag{2}$$

$$I_{int} \cdot T_{int} = I_{deint} \cdot T_{deint}$$

$$T_{deint} = \frac{I_{int}}{I_{deint}} \cdot T_{int}$$

The use of dual-slope conversion therefore provides path-independence (in voltage), which supports the fact that both capacitance and voltage must be intermediate variables which cancel out in Equation (1). Any non-linearity in $C_{int}$ therefore does not matter, and also renders the A/D insensitive to component drift. Furthermore, since $I_{int}$ and $I_{deint}$ are both generated by the same OTA with bias current $I_b$, any dependence of these currents on $I_b$ is divided out when we take the ratio of the currents in Equation (2). The ratiometric nature of the converter provides it with immunity to temperature and other slow variations in $I_b$.

Figure 2:
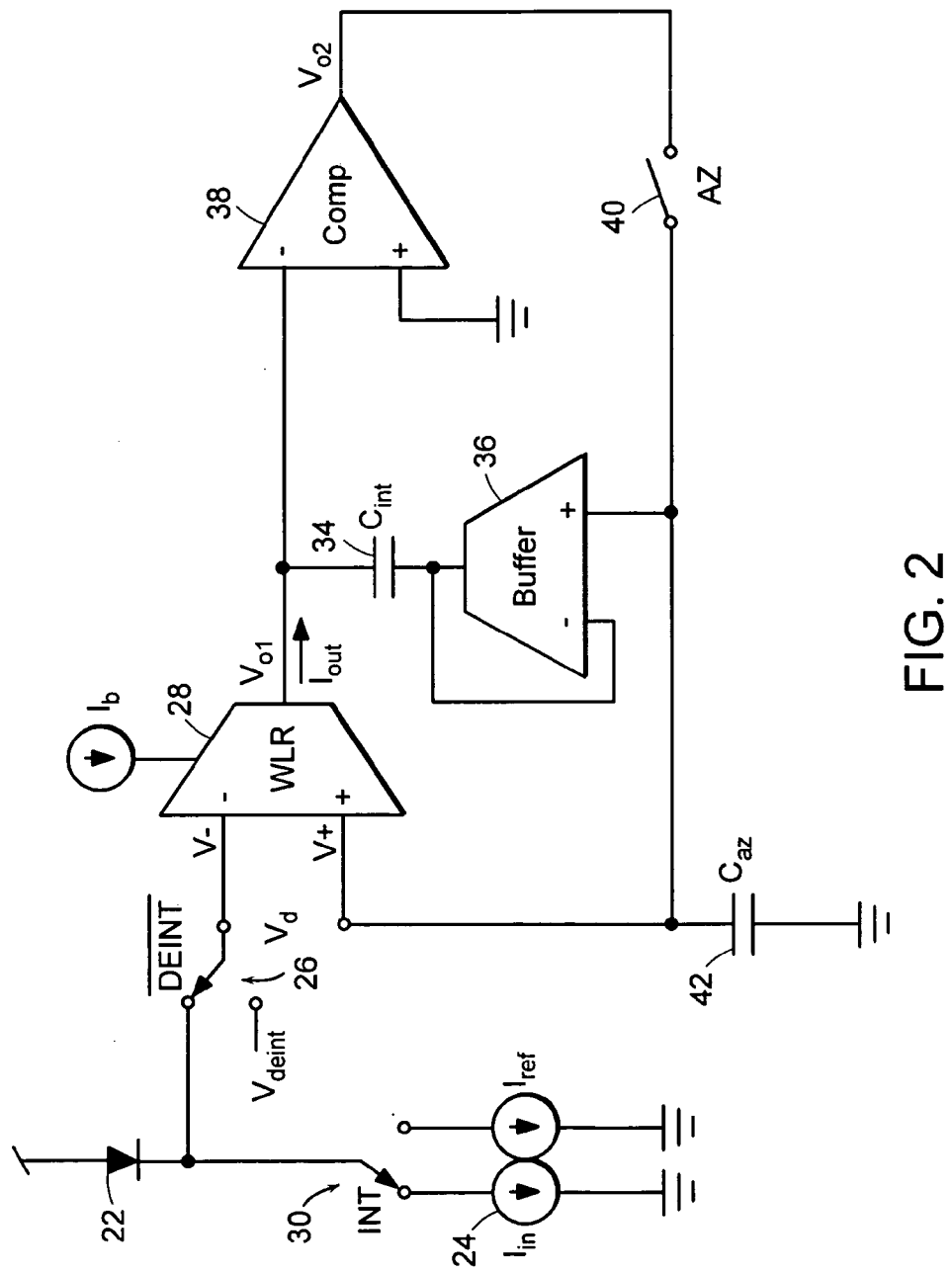
FIG. 2 shows an illustrative diagrammatic schematic view of a circuit implementation of a temperature compensation circuit used in a global feedback system in accordance with an embodiment of the invention.

The voltage $V_{in}$ (or equivalently, the differential voltage $V_d$) must be a logarithmic function of the current input, $I_{in}$ for the dual-slope converter to be a logarithmic A/D. The logarithm is easily implemented by letting $I_{in}$ drop a voltage across a device with an exponential I-V characteristic. The device is typically a diode, a bipolar transistor, or a MOS transistor in the sub-threshold regime. A logarithmic input stage to an A/D converter in accordance with an embodiment of the invention, therefore, may thus be implemented as shown in FIG. 2 using a diode 22 that is coupled to the current input (represented as 24) and to the negative input of the wide linear range transconductance amplifier 28. The circuit also includes an integrating switch 30 and a de-integrating switch 26 as shown, an integrating capacitor 34, a buffer 36 and a comparator 38, as well as an auto-zeroing switch 40 and an auto-zeroing capacitor 42.

During the auto-zeroing phase, the integrating switch is switched to $I_{ref}$, the de-integrating switch 26 is switched to $\overline{\text{DEINT}}$, and the auto-zeroing switch 40 is switched on. The reference input current ($I_{ref}$) corresponding to a minimum envelope detector output is fed to the diode 22, the output of the WLR 28 is brought to zero, and the output of the comparator 38 is brought to the voltage on the negative input of the wide linear range transconductance amplifier 28.

During the integrating phase, the integrating switch is switched to $I_{in}$, the de-integrating switch 26 remains on $\overline{\text{DEINT}}$, and the auto-zeroing switch 40 is switched off. The output of the comparator 38 drops and the output of the WLR 28 begins to rise for a fixed period of time. After the fixed time, the integrating phase ends and the de-integrating phase begins.

During the de-integrating phase, the integrating switch remains on $I_{in}$, the de-integrating switch 26 is switched to $V_{deint}$, and the auto-zeroing switch 40 remains off. The output of the WLR 28 now begins to fall and a digital counter begins counting. The digital counter stops counting when the output of the WLR 28 returns to zero. The count reached is provided as the digital output of the circuit.

Figure 3:
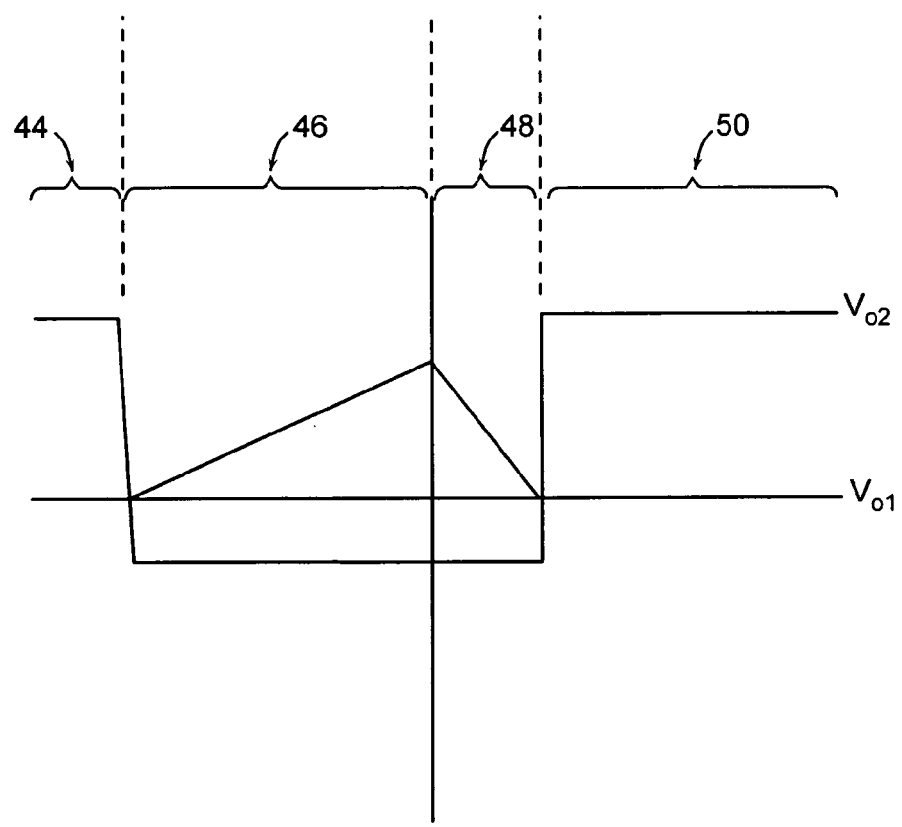
FIG. 3 shows an illustrative diagrammatic graphical representation of dual-slope and comparator waveforms in a system in accordance with an embodiment of the invention.

FIG. 3 shows an illustrative diagrammatic graphical representation of the outputs of the WLR 28 ($V_{o1}$) and the comparator 38 ($V_{o2}$) in a dual-slope conversion cycle. The auto-zeroing phase is shown at 44 and 50, the integrating phase is shown at 46, and the de-integrating phase is shown at 48. The voltage $V_{o1}$ shows the dual-slope waveform, with an upward integration for a fixed time ($T_{int}$), the de-integration for a measured time ($T_{deint}$), and finally the auto-zeroing phase once de-integration is complete. The voltage $V_{o2}$ shows the comparator output going low upon the start of integration. Once de-integration is complete, $V_{o2}$ goes high again, and like $V_{o1}$, auto-zeroes to its initial level immediately thereafter.

The voltage across the diode 22 in the circuit of FIG. 2 increases by $\phi_T$ per e-fold increase in current. The differential voltage $V_d$ is therefore given by Equation (3).

$$V_d = \phi_T \ln \frac{I_{in}}{I_s} - \phi_T \ln \frac{I_{ref}}{I_s} \quad (3)$$

$$= \phi_T \ln \frac{I_{in}}{I_{ref}} \quad (\log I \to V \text{ transformation})$$

By taking the difference between two logarithmic voltages, the dependence on the saturation current of the diode $I_s$ is cancelled, and any temperature coefficient common to $I_{in}$ and $I_{ref}$ is also divided out. This is important because $I_s$ and sub-threshold currents both vary strongly with temperature. The temperature dependence remaining in $V_d$ is now merely proportional to absolute temperature (PTAT). The transfer function from $I_{in}$ to $I_{out}$ in the circuit of FIG. 2 is given by Equation (4).

$$I_{out} = G_m \cdot V_d \quad (\text{linear } V \to I \text{ transformation}) \quad (4)$$

$$= \frac{I_b}{V_L} \cdot \phi_T \ln \frac{I_{in}}{I_{ref}}$$

where $V_L$ is defined as the linear range of the $G_m$ transconductor, and $I_b$ is its bias current. Since the linear range of a sub-threshold transconductor is also PTAT because of its dependence on $\phi_T$, the PTAT dependence of $\phi_T$ cancels with the PTAT dependence of $V_L$, and $I_{out}$ now only bears the temperature dependence of $I_b$. The dual slope topology however, cancels the temperature dependence of $I_b$ as well. Equation (2) shows that if the integration and deintegration currents are both proportional to $I_b$ as they are in the circuit of FIG. 2, then the final digitized value that is proportional to $T_{deint}$ is independent of $I_b$.

The WLR and diode should be in thermal proximity for accurate cancellation. More importantly, the circuit must be operated within the linear range of the transconductor at all times. The techniques of bump linearization may be used in certain embodiments. The use of well-inputs and source degeneration may also be employed to extend $V_L$ to at least 180 mV, which is the diode voltage range corresponding to a 60 dB range in input current.

In further embodiments of the invention, the use of global feedback may be replaced by a local feedback topology as discussed below. Global feedback networks have traditionally been used for auto-zeroing dual-slope integrators, such that offsets in the integrator and comparator blocks can be zeroed out together. In global feedback circuits, one global feedback loop automatically ensures that the offset of the WLR and the offset of the comparator are zeroed out. A local feedback scheme for zeroing offsets provides that two separate feedback loops be used for zeroing offsets associated with the WLR and the comparator.

A global feedback circuit may provide poor phase margin without compensation because the WLR and comparator blocks have high D.C. gain and slow dominant poles. A split-pole compensation technique may be employed in standard two-stage operational amplifiers to improve closed-loop dynamics during the auto-zeroing phase. Such compensation creates a dominant pole via Miller multiplication of the compensation capacitor $C_{int}$ at the $V_{o1}$ node and a fast pole typically well beyond the loop crossover frequency.

The operational transconductance amplifier (OTA) buffer, implemented with a transconductance amplifier of value Gm3, adds a feedback resistance of value $1/G_{m3}$ in series with $C_{int}$ to create a stabilizing left-half-plane (LHP) zero at high frequencies. Simultaneously, the OTA buffer prevents current from feeding forward through $C_{int}$, and creating a destabilizing right-half-plane (RHP) zero. The buffer also prevents capacitive feedthrough from $V_{int}$ to $V_+$ from corrupting the stored voltage on $C_{az}$.

A dual-slope converter having the topology shown in FIG. 2 may be fabricated in a 1.5 μm process, with $C_{int}$=1.5 pF and $C_{az}$=2 pF. When biased with the requisite current to be stable at a sampling rate of 300 Hz, the power spectral density (PSD) of the noise on $V_{o2}$ may be measured during the auto-zeroing phase, and found to have very good agreement with calculated contributions from the effective input-referred noise sources of the WLR, the comparator and the buffer respectively. The calculations may take into account shot noise from all transistors in the circuit (the dominant form of noise in sub-threshold MOS operation) and its effect on the overall circuit noise due to differing noise transfer functions to the output from various noise sources.

The thermal noise of $V_{o2}$ is sampled directly onto the input $V_d$ at the end of the auto-zeroing phase. It results in a random sample-to-sample gain error during integration and during de-integration. The 1/f noise power and low-frequency thermal noise is adapted out during auto-zeroing if the sampling is sufficiently fast: Low-frequency noise effectively behaves like a slowly varying offset that does not change during the conversion interval and is auto-zeroed out. The converter's precision is affected b a measured 375 μVrms of noise on $V_{o2}$. The 375 μVrms number only measures the standard deviation of the noise distribution. The peak-to-peak noise amplitude is almost 3 mV, because the peak-to-rms ratio of a Gaussian noise signal is 3–3.5, implying that the peak-to-peak noise is 6–7 times the rms value.

The above converter uses sub-threshold MOS diodes and therefore has an input full scale of $\phi_T/\kappa \cdot \ln(1000) \approx 280$ mV. Hence 3 mV of thermal noise at the input immediately restricts us to an analog precision of 280/3≈93 discriminable levels, or 6.5 bits. This precision may be confirmed using a standard sine-tone signal-to-noise ratio (SNR) test for A-to-D converters. For example, a 100.1 Hz sine input stroboscopically sampled at 300 Hz has an SNR of 34 dB, yielding a precision of 5.3 bits. The degradation of ~1 bit from the analog precision of 6.5 bits is due to additional noise introduced by quantization of the analog signal.

It is believed that other sources of noise in the circuit should not limit the system's precision similar to the sampled thermal noise of $V_{o2}$. For example, the input-referred noise of the comparator is sampled onto $V_{o1}$ during auto zeroing but does not result in much error because it is a small fraction of the 2V full scale of $V_{o1}$. Effectively, when referred to the input, the latter error is reduced by the gain of the integrating stage, $A_{int}$≙2V/280 mV. The noise at the input diode and the noise due to the integration of the shot-noise output currents of the WLR during integration and de-integration, as well as the input-referred voltage noise of the comparator at the termination of the conversion operation, and the noise contribution of the buffer during conversion were all found to be small in comparison with the sampled thermal noise on $C_{az}$.

The analog power consumption of the various stages is listed in TABLE I.

TABLE I

POWER CONSUMPTION OF GLOBAL FEEDBACK CONVERTER

| Block | Power consumption |
|---|---|
| WLR | 0.09 μW |
| Comparator | 0.30 μW |
| Buffer | 0.30 μW |
| $V_{deint}$ biasing | 0.27 μW |
| Total | 0.96 μW |

As discussed above, the precision of a global feedback topology is determined by the level of thermal noise sampled onto the offset capacitor $C_{az}$. In further embodiments of the invention, a local feedback design may be employed in which feedback loops are closed around each amplifier block individually. This strategy enables the noise on $C_{az}$ to be lowered at the same level of power, and consequently improves the precision.

Figure 4:
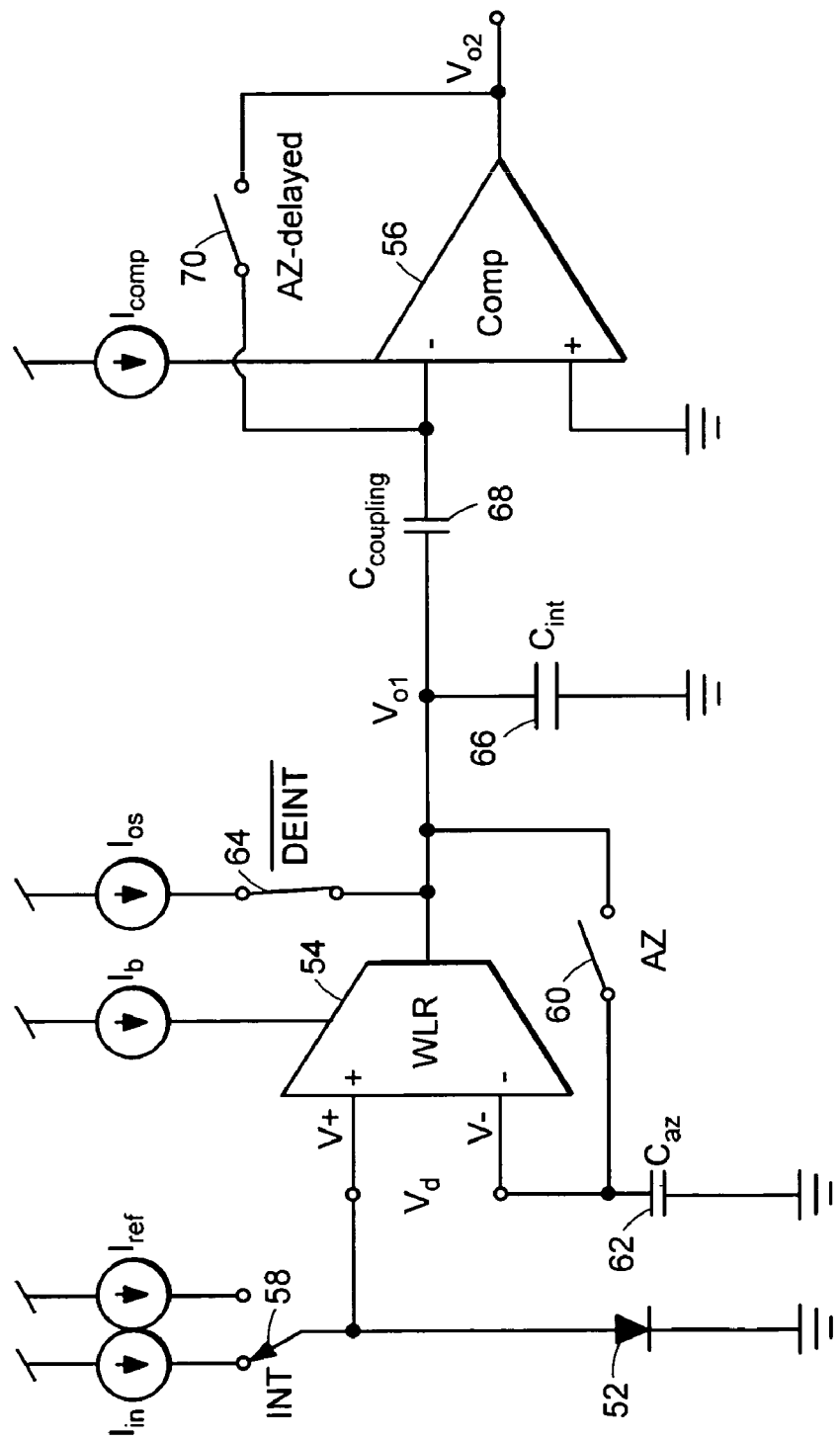
FIG. 4 shows an illustrative diagrammatic schematic view of al logarithmic analog to digital converter with local feedback topology in accordance with an embodiment of the invention.

A schematic diagram of a system in accordance with an embodiment of the invention that employs a local feedback design is shown in FIG. 4. As shown in FIG. 4, such a system includes a temperature compensation circuit that includes a diode 52, a wide linear range transconductance amplifier 54, and a comparator 56. The positive input to the wide linear range transconductance amplifier 54 is coupled to the diode 52 and is switchable between $I_{in}$ and $I_{ref}$ by a switch 58 as shown. The wide linear range transconductance amplifier 54 is powered by a current source $I_b$ and the wide linear range transconductance amplifier 54 includes a local feedback loop from the output of the amplifier 54 to its negative input, and the amplifier local feedback loop includes an auto-zeroing switch 60 and an auto-zeroing capacitor 62. The output of the amplifier 54 ($V_{o1}$) is also coupled to a current source $I_{os}$ via a de-integrating switch 64 and to an integrating capacitor 66 ($C_{int}$). The negative input to the comparator 56 is coupled to the output of the amplifier 54 via a coupling capacitor 68, and the comparator 56 includes a comparator local feedback network that includes a delayed auto-zeroing switch 70. The positive input to the comparator 56 is tied to ground and the output of the comparator provides the output signal ($V_{o2}$).

During operation, in the auto-zeroing phase, the integrating switch 58 is switched to $I_{ref}$, the de-integrating switch 64 is switched on, the auto-zeroing switch 60 is switched on, and the auto-zeroing delayed switch 70 is switched on. The reference input current ($I_{ref}$) corresponding to a minimum envelope detector output is fed to the diode 52, the output of the wide linear range amplifier 54 is brought to the voltage on its positive input, and the output of the comparator 56 is brought to zero.

During the integrating phase, the integrating switch 58 is switched to $I_{in}$, the de-integrating switch 64 remains on $\overline{DEINT}$, the auto-zeroing switch 60 is switched off, and the auto-zeroing switch 70 is also switched off. The output of the comparator 56 drops and the output of the amplifier 54 begins to rise for a fixed period of time. After the fixed time, the integrating phase ends and the de-integrating phase begins.

During the de-integrating phase, the integrating switch 58 remains on $I_{in}$, the de-integrating switch 54 is switched to $V_{deint}$, the auto-zeroing switch 60 remains off, and the auto-zeroing switch 70 remains off. The output of the amplifier 54 now begins to fall and a digital counter begins counting. The digital counter stops counting when the output of the amplifier 54 returns to its initial value. The count reached is provided as the digital output of the circuit.

The operation is similar to the global feedback topology; when AZ and AZ-delayed are closed, the amplifier and comparator both auto-zero their offset. During this time, $I_{ref}$ is applied to the input diode, and $I_{os}$ to the output of the amplifier. Switch AZ (60) is opened just before AZ-delayed (switch 70), to avoid the latter's charge injection from affecting $C_{az}$. In the integrate phase, $I_{in}$ is switched onto V+, and the amplifier charges up $C_{int}$ with a current proportional to its input differential voltage, $V_d$, which measures the log of $I_{in}/I_{ref}$. To de-integrate, $I_{ref}$ is switched back onto the diode, and $I_{os}$ is disconnected from $V_{o1}$ by turning off the de-integrating switch 64. This action forces the amplifier to discharge $C_{int}$ with a current equal in magnitude to $I_{os}$. The current $I_{os}$ serves as the de-integration current, and is a scaled copy of $I_b$ in order to preserve the ratiometric cancellation described by Equation (2).

There are several reasons why the noise on $C_{az}$ is lowered in this topology. First, the number of devices that contribute noise to $C_{az}$ is reduced to essentially the number in the amplifier 54 alone. This is because the comparator noise is greatly attenuated by a D.C.-blocking capacitor ($C_{coupling}$), so its effect on $V_{o1}$ is minimal. In contrast, in the global feedback loop, buffer 36 and comparator 38 both contribute noise to $C_{az}$ in addition to the amplifier 28. Second, it may be realized from TABLE I that a large quantity of power is spent in the buffer, to compensate the global feedback loop. In this topology, each amplifier is unity-gain stable, hence no compensation is required. All the power that was spent on compensation can therefore be used to increase the bias in the WLR, which allows a bigger value of $C_{int}$ to be used, while maintaining the same sampling rate. The larger value of $C_{int}$ therefore lowers the WLR noise, which is the dominant source of noise. The redistribution of power is listed in TABLE II below.

TABLE II

POWER CONSUMPTION OF LOCAL FEEDBACK CONVERTER

| Block | Power consumption |
|---|---|
| WLR | 0.60 µW |
| Comparator | 0.30 µW |
| $I_{os}$ biasing | 0.15 µW |
| Total | 0.96 µW |

Such systems of the above embodiment of the invention also allow the effect of charge injection to be minimized. Charge injection from AZ does not affect the comparator offset, since the comparator is still being reset when switch AZ (60) is switched off. Also, when AZ-delayed breaks the feedback around the comparator, the charge injection onto $C_{int}$ is divided by the gain of the integrating stage, $A_{int}$. Thus, the only charge injection that matters is that of the switch AZ onto $C_{az}$. Even this is only a fixed offset error however, which does not reduce the precision of the converter. This approach to minimizing charge-injection is useful in certain applications.

The current $I_{os}$, serves not only as the de-integration current, but also to offset the amplifier into the negative quadrant of its linear range, thus doubling the useable linearity of the amplifier. The importance of minimizing the amplifier's linear range can be understood from the shot noise calculations of a sub-threshold $G_m$-C filter where N is the equivalent number of shot noise sources. These calculations are given in Equation (5) below.

$$\text{WLR PSD}^2 = \frac{N \cdot 2q \cdot (I_b/3)}{Gm^2} = \frac{N \cdot 2q \cdot V_L^2}{3I_b} \quad (5)$$

$$\text{WLR Noise}^2 = \text{WLR PSD}^2 \cdot BW \cdot \frac{\pi}{2}$$

$$= \frac{N \cdot 2q \cdot (I_{Bb}/3)}{Gm^2} \cdot \frac{Gm}{2\pi C} \cdot \frac{\pi}{2}$$

$$\text{WLR Noise} = \sqrt{\frac{N \cdot q \cdot V_L}{6C}}$$

The current $I_b/3$ flows through each transistor instead of the usual $I_b/2$, due to the use of bump-linearization to extend $V_L$. As the total noise increases with the square root of $V_L$, the value $V_L$ needs to be as low as possible and still handle the full input range. Real diodes are used to be compatible with the amplifier's reduced linear range; hence this converter has an input full scale of 180 mV corresponding to a 60 dB range in input current.

The amplifier noise may be reduced by the difference in $\sqrt{(N \cdot V_L)}$ between two different WLR amplifier topologies by using $I_{os}$ to halve the requirement on $V_L$. A gate-input WLR with a smaller $V_L$ (N=7, $V_L$=240 mV) will achieve $\sqrt{2.5}$ or 1.6× less noise than a well-input WLR (N=3.5, $V_L$=1.2V) for the same sized $C_{int}$. Although this improvement accounts for less than a 1-bit increase in precision, it is nevertheless significant. As more power may be used in the WLR, and a smaller $V_L$ may be employed, the value of $C_{int}$ may be increased from 1.5 pF in the global-feedback case to 30 pF, while maintaining the same closed-loop bandwidth as before, i.e., $G_m/(2\pi C)$=1.3 kHz. In addition, $C_{az}$ and $C_{coupling}$ were set at 10 pF each, bringing the total capacitance seen at $V_{o1}$ to 50 pF during auto-zeroing. The shot noise contributed by the WLR is therefore reduced by a factor of $\sqrt{(50pF/1.5pF) \times 2.5} = \sqrt{83}$ or roughly 9× from the global feedback topology. TABLE III summarizes the various mechanisms for noise reduction between the global and local feedback topologies.

TABLE III

REDUCTION IN WLR NOISE (ASSUMING $G_M$ - C CONFIGURATION), ALLOWED FOR BY A CHANGE IN TOPOLOGY

| Parameter | Well-input WLR | Gate-input WLR |
|---|---|---|
| N | 3.5 | 7 |
| $V_L$ | 1.2 V | 240 mV |
| $C_{int}$ | 1.5 pF | 50 pF |
| Total Noise | 273 µVrms | 30 µVrms |

It may be remembered that the measurement of total noise for the global feedback topology is 375 µVrms, rather than 273 µVrms as expected from Table III, because the well-input WLR is not in a unity feedback $G_m$-C configuration. The loop dynamics and contributions from other amplifiers thus account for an additional 100 µV of noise in global feedback, which is substantial. Also, by reducing the WLR noise to 30 µVrms, another thermal noise source that was previously negligible now becomes comparable, namely, the noise contributed from the input diode. The effect of the diode may be determined as follows where $I_{ref}$=320 pA, $g_m=I_{ref}/\phi_T$, and N=2 (because the current source feeding the diode also accounts for one device worth of noise). These calculations are shown in Equation (6).

$$\text{Diode } PSD = \sqrt{\frac{N \cdot 2q \cdot I_{ref}}{g_m^2}} = \sqrt{\frac{2 \cdot 2q \cdot \phi_T^2}{I_{ref}}} \approx 1.2 \text{ } \mu V/\sqrt{Hz} \quad (6)$$

$$\text{Diode Noise} = \text{Diode } PSD \times \sqrt{WLR \text{ } BW \times \frac{\pi}{2}}$$

$$= 1.2 \text{ } \mu V/\sqrt{Hz} \times \sqrt{1.3 \text{ kHz} \times \frac{\pi}{2}} \approx 54 \text{ } \mu Vrms$$

The combined effect of the diode noise and the WLR noise (which are independent of one another) may be determined by taking the square root of the sum of their squares. In addition, The total noise PSD may be predicted by the same method. Using $I_b$=100 nA, N=7 and $V_L$=0.24V the WLR PSD can be calculated from Equation (5). The results are shown in TABLE IV below.

TABLE IV

TOTAL NOISE CONTRIBUTIONS FROM WLR AND DIODE

|  | PSD ($\mu V/\sqrt{Hz}$) | Total noise ($\mu Vrms$) |
|---|---|---|
| WLR | 0.66 | 30 |
| Diode | 1.2 | 54 |
| Total | 1.4 | 62 |

Local feedback therefore, achieves a roughly 6× reduction in noise, amounting to an extra 2½ bits of precision, when compared with ~375 µVrms of noise in the global feedback topology. Thus substantial improvements over dual-slope topologies that employ global feedback for auto-zeroing may be obtained by using local feedback.

Experimental values for the PSD and total integrated noise on node $V_{o1}$ may be obtained together with circuit simulation results. The $I_{ref}$ used may be 320 pA, corresponding to a minimum detectable level for $I_{in}$. Measured results are should agree closely with simulation, and also match predicted levels from theory: The measured PSD is 1.39 µV/$\sqrt{Hz}$, matching the calculated level of 1.4 µV/$\sqrt{Hz}$. A first-order roll-off may also be observed slightly above 1 kHz, near the calculated closed-loop bandwidth of 1.3 kHz. Finally, the total integrated noise comes to 70 µVrms, near the calculated level of 62 µVrms. From Equation (6), it may be predicted that as $I_{ref}$ is increased, the diode PSD will become negligible compared with the WLR PSD. To verify this prediction, the total PSD at V+ and $V_{o1}$ in FIG. 12 at various levels of $I_{ref}$ may be measured and are shown in FIG. 5.

Figure 5:
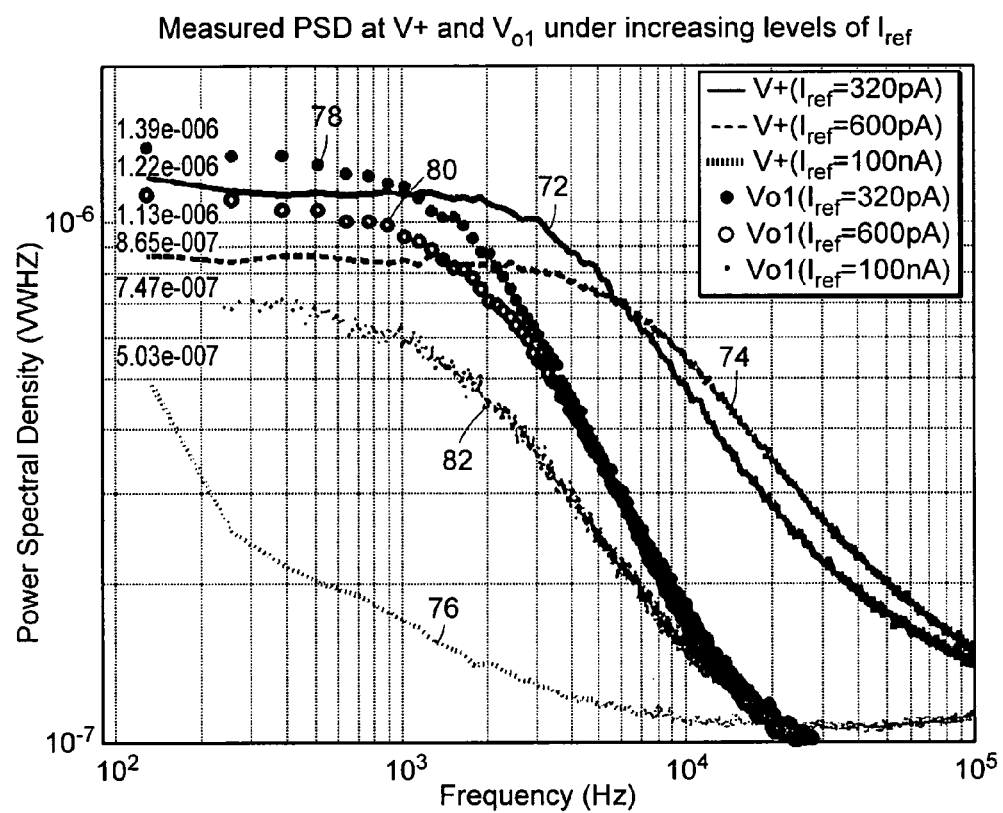
FIG. 5 shows an illustrative diagrammatic graphical representation of frequency versus power spectral density for various reference currents showing a reduction in power spectral density with increasing values of a reference current for a system in accordance with an embodiment of the invention.

FIG. 5 shows the relationship between frequency and power spectral density (PSD) for measured PSD at $V^+$ and $V_{O1}$ under a range of levels of $I_{ref}$. In particular, the relationship for $V^+$ with $I_{ref}$=320 pA, $I_{ref}$=600 pA, and $I_{ref}$=100 nA is shown at 72, 74 and 76 respectively, and the relationship for $V_{O1}$ with $I_{ref}$=320 pA, $I_{ref}$=600 pA, and $I_{ref}$=100 nA is shown at 78, 80 and 82 respectively. As shown in FIG. 5, when $I_{ref}$=100 nA, the measured PSD of 750 nV/$\sqrt{Hz}$ on $V_{o1}$ is dominated by the noise of the WLR, not by the noise of the diode. This noise is slightly higher than the predicted 660 nV/$\sqrt{Hz}$ thermal noise of the WLR because of the influence of 1/f noise, somewhat significant at the high bias current level of $I_b$=100 nA in the WLR. In sub-threshold, 1/f noise becomes more significant at relatively higher bias levels but is still usually not as dominant as thermal noise. Not surprisingly, the total integrated noise is 70 µVrms, slightly higher than the calculated value of 62 µVrms. A value of $I_{ref}$ that is approximately 320 pA makes the thermal noise of the diode dominant over the WLR and sets the minimum required current input to the circuit.

The diode's underlying contribution may be determined, therefore, by looking at the power spectrum on V+. The PSD is indeed 1.2 µV/$\sqrt{Hz}$ when $I_{ref}$=320 pA, and reduces by a factor of $\sqrt{2}$ when $I_{ref}$ is doubled, verifying the theoretical calculations in Equation (6). Also, the −3 dB bandwidth at V+ is around 5 kHz, and indeed higher than the 1.3 kHz bandwidth set by the WLR. Thus, V+ has the ability to follow faster signals if a higher sampling rate is desired. When $I_{ref}$=100 nA, the noise power contributed by the diode (measured by the PSD on V+) drops far below the PSD measured on $V_{o1}$. Time-domain measurements should confirm the expected 70 µVrms of noise on $V_{o1}$, and the approximate 420 µV peak-to-peak 6σ a spread of this noise in a Gaussian distribution. The analog precision is therefore limited to 180/0.42≈428 discriminable levels, or 8.7 bits. The converter once again suffers the loss of ~1 bit in the quantization process, and yields a final precision of 7.8 bits as shown by the SNR measurement in FIGS. 6A and 6B. It can be concluded that this converter is therefore thermal-noise limited by the thermal noise of the diode.

Figure 6A:
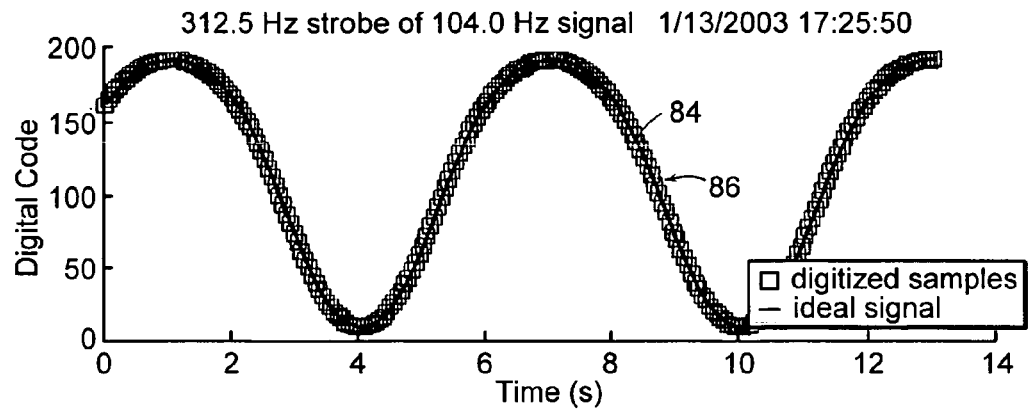
FIGS. 6A and 6B show illustrative diagrammatic graphical representations of quantization noise and analog noise responsive to a sinusoidal input signal in a signal to noise ratio test of the local feedback converter for a system in accordance with an embodiment of the invention.
Figure 6B:
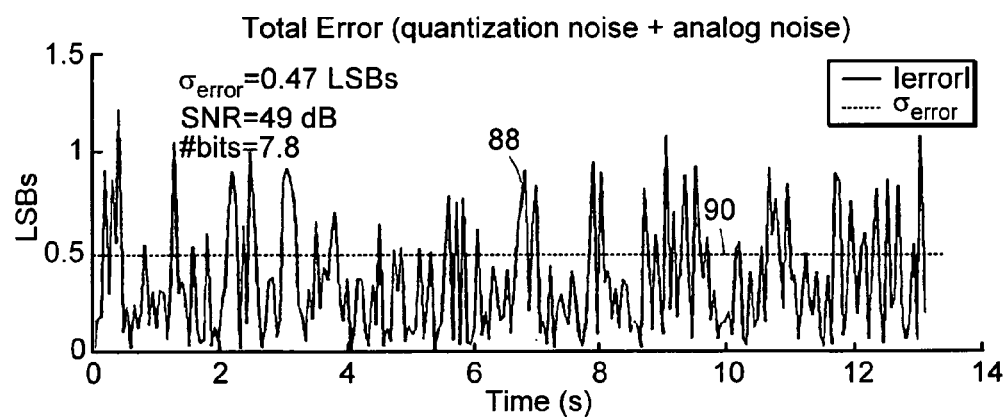

In particular, FIG. 6A shows an ideal signal 84 and digitized samples 86 for a 312.5 Hz strobe of a 104.0 Hz signal, and FIG. 6B shows the total error (quantization noise and analog noise) for a 7.8 bit system with an SNR of 49 dB and $\sigma_{error}$=0.47 LSBs. The |error| is shown at 88 and the $\sigma_{error}$ is shown at 90. These results show that the local feedback converter indeed presents a 6× or 2½-bit improvement over the 5.3-bit global feedback converter, to arrive at a digital precision just under 8 bits at the same level of power.

Figure 7:
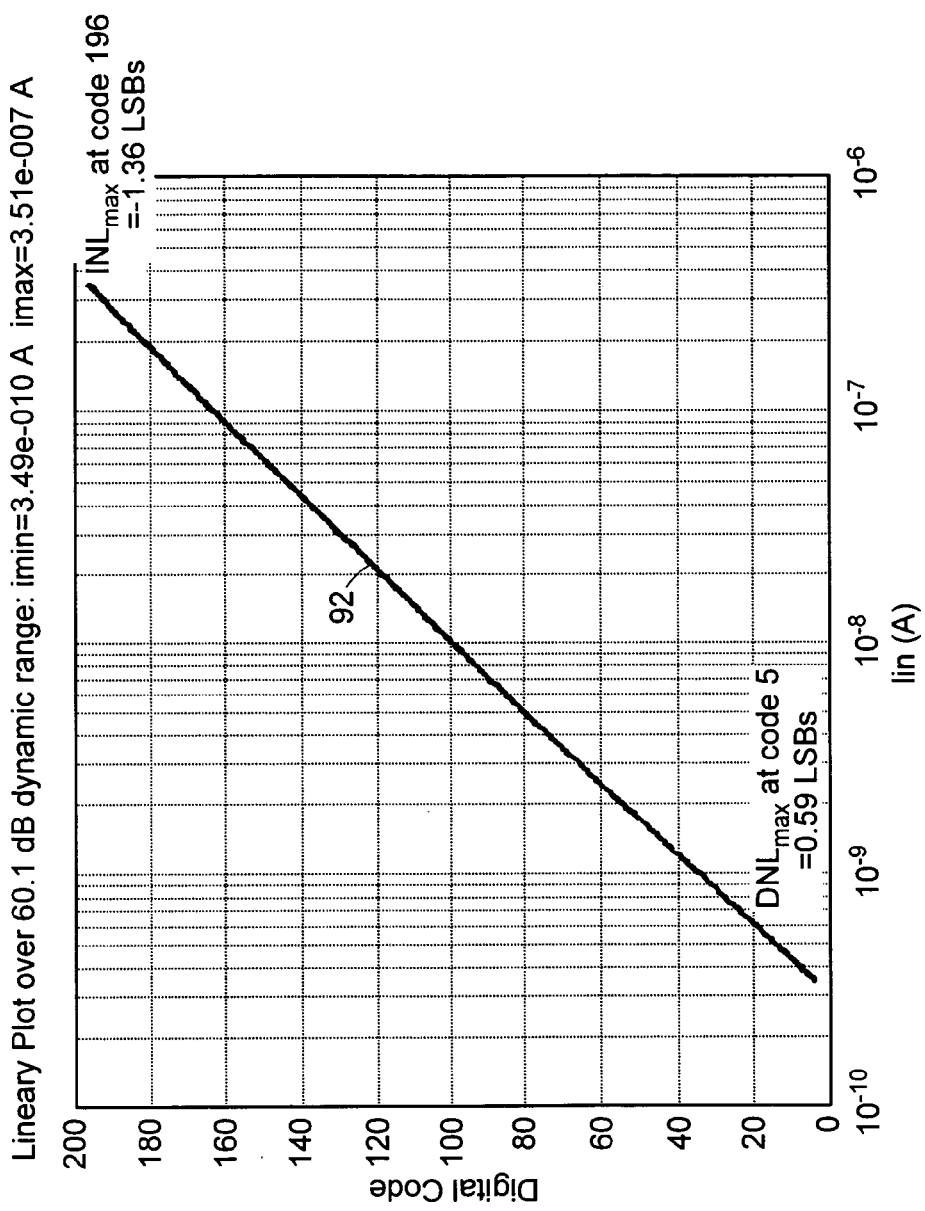
FIG. 7 shows an illustrative diagrammatic graphical representation of a transfer curve showing a logarithmic analog-to-digital conversion for a system in accordance with an embodiment of the invention.

The system also exhibits good linearity. The current input was swept over 60 dB from 350 pA to 350 nA, and the transfer curve shown at 92 in FIG. 7. The transfer characteristic is monotonic and fairly linear. The integral non-linearity (INL) and differential non-linearity (DNL) were computed. The average INL may be computed to be approximately 1 LSB and the average DNL may be computed to be approximately ½ LSB. The worst case INL and DNL are shown at either end of the transfer curve 92 in FIG. 7.

To test the A/D's power supply rejection, a 100 m Vpp tone may be applied to its power supply rail, and the degradation in analog precision may be obtained by measuring the total spread of the output pulse $T_{deint}$ timing jitter. Data from such a test is shown in FIGS. 8A and 8B where the peak to peak spread in jitter is shown at 94 and the $\sigma(T_{deint})$ is shown at 96 of FIG. 8A. The analog precision of the converter is shown at 98 in FIG. 8B for the power supply rejection of a 0.1 Vpp tone on Vdd. At an 8-bit, 312.5 Hz sampling rate, the pulsewidth of 1 LSB or 1 clock cycle corresponds to 6.25 µs. Hence the analog precision of the converter may be expressed in bits. FIG. 8B shows that over a wide range of interfering power-supply frequencies, the converter maintains 9 bits of analog precision (degraded to 8 bits by quantization). These results may be obtained by supplying the logmap with fixed inputs and fixed biases— from two off-chip current references, each having ~60 dB of power supply rejection. In sub-threshold, where an exponential sensitivity to gate voltage exists, it is necessary to use such references for robust current biasing. In any event, systems of certain embodiments of the invention should operate robustly as long as $I_{in}$ and $I_{ref}$ vary concomitantly with an interfering signal.

As discussed above, the differential voltage $V_d$ of the WLR due to the input diode and the linear range of the WLR, $V_L$, are both PTAT. The output of the logmap, which is determined by their ratio, is therefore invariant with temperature. The dual-slope converter also divides out any temperature-dependent change in both the integration current (proportional to $I_b$) and de-integration current (proportional to $I_{os}$) as described in Equation (2).

Figure 9:
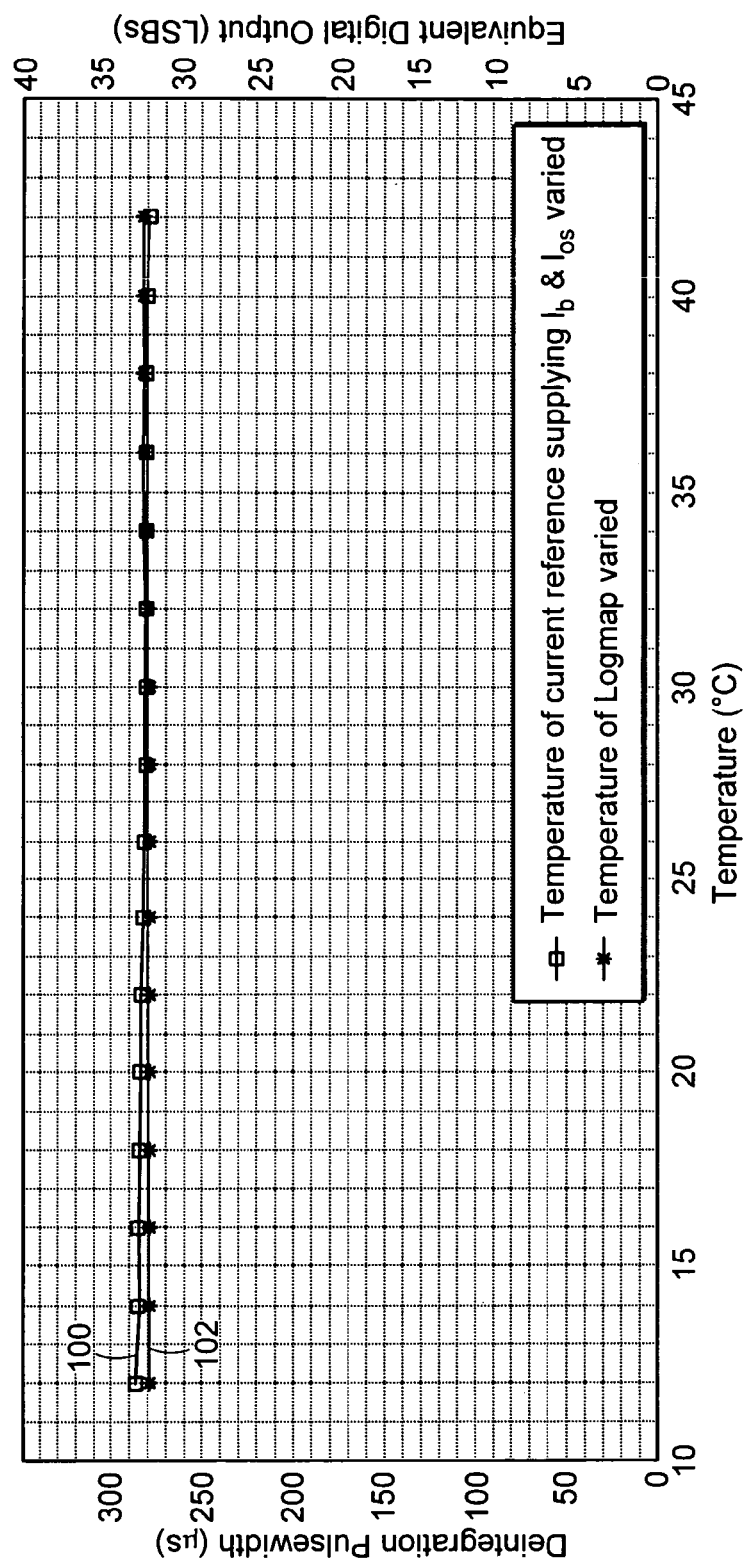
FIG. 9 shows an illustrative diagrammatic graphical representation of the temperature response with fixed (current reference supplied) inputs for a system in accordance with an embodiment of the invention.

FIG. 9 shows data from experiments designed to test these hypotheses over a range of temperatures from 12° C. to 42° C. In particular, FIG. 9 shows the logmap temperature response with fixed (current reference supplied) inputs where the temperature of current reference supplying $I_b$ and $I_{os}$ was varied is shown at 100, and where the temperature of the logmap was varied is shown at 102. The temperatures were controlled with a system that uses a high-velocity temperature-controlled air stream with thermo-coupled feedback to precisely set the temperature of a device. When the temperature of the logmap itself is varied, the total change over 30° C. is less than ½ an LSB. The asterisk data at 102 thus show that the $V_d$-with-$V_L$ temperature cancellation is effective. When the temperature of a PTAT current reference supplying both $I_b$ and $I_{os}$ is varied, the response is shown at 100 and the total change over 30° C. is seen to be less than one LSB. The temperature dependence therefore, of this 8-bit logmap is better than 150 ppm/° C.

Figure 10:
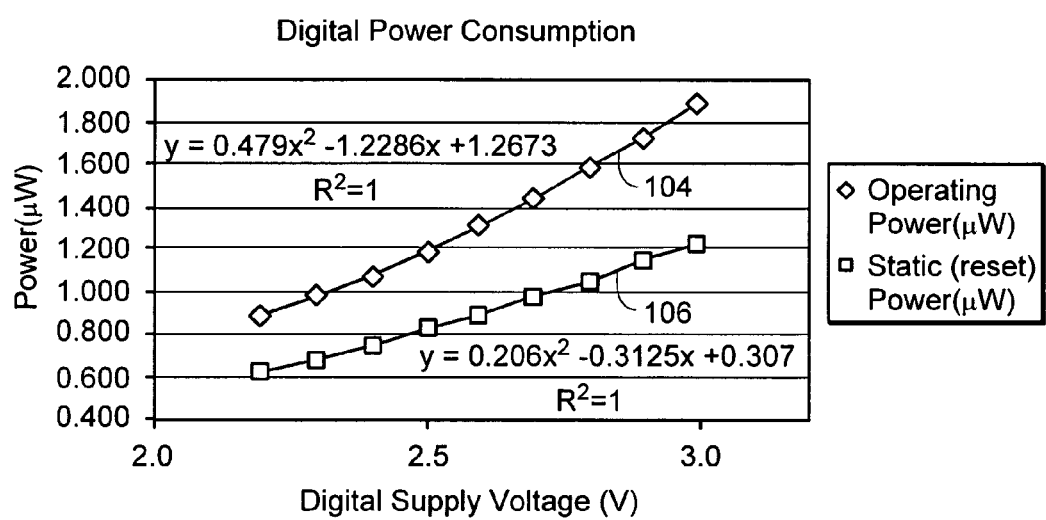
FIG. 10 shows an illustrative diagrammatic graphical representation of digital supply voltage versus power for a system in accordance with an embodiment of the invention.

The digital power consumption of a system of the present embodiment was also measured and is shown in FIG. 10 as the digital power supply is increased from 2.2V to 3V, with a static mid-range input applied. In particular, the voltage versus power relationship is shown for operating power at 104 and is shown for static power at 106. The digital section is seen to consume ~2 µW of power on a 3V rail. The data was fit to a quadratic model, and the near perfect fit is as expected from the formula $P=f \cdot C \cdot V_{dd}^2$. The digital counter consumes most of the power even when the controller is held in reset, as shown by the square boxes. Thus it may be concluded that the controller consumes only 33% to 40% of the total power. Significant power savings therefore, may be obtained in multi-channel systems by latching a single global counter's value into each local converter at the termination of its de-integration pulse. As the counter accounts for ~60% of a single converter's digital power, the average digital power can be cut by more than half if 1 counter is shared amongst 6 or more converters.

Power consumption may also be reduced by over a factor of 2 if the digital supply is lowered to 2.2–2.3V even as the analog supply is maintained at 3V. All capacitances should also be able to be reduced to scale down at least an order of magnitude if ported from a 1.5 µm process to a sub-micron process. The digital power should then be negligible compared with the 1 µW analog power. Thus, the present design could be modified to operate on a single microwatt of power.

The power consumption of the present embodiment of the converter scales linearly with sampling rate, because a higher sampling rate requires an increase in both the clock frequency (digital power) and also in the bias currents $I_b$ and $I_{os}$ (analog power). For constant sampling rate, digital power scales linearly with increased precision P ($2^{\#bits}$) because counting an extra bit at the same sampling rate means that the clock speed must double. For constant sampling rate, analog power scales quadratically with precision as an increase in precision under a thermal-noise regime requires a squared increase in capacitance. Thus, for constant analog power consumption, it is possible to reduce the capacitance by 4×, halve the precision, and obtain four times the sampling rate. These relationships are summarized in TABLE V below.

TABLE V

RELATIONSHIP BETWEEN PRECISION, SAMPLING RATE AND POWER IN THE THERMAL-NOISE LIMITE LOGMAP

|  | Analog Power | Digital Power |
|---|---|---|
| Precision (P) | $\propto P^2$ | $\propto P$ |
| Sampling Rate ($f_s$) | $\propto f_s$ | $\propto f_s$ |

The factor of ~100× in power savings over a DSP, robust temperature and matching performance, and an architecture suited to parallel implementation makes an analog logarithmic A/D solution very attractive for the next generation of fully-implanted cochlear implants or portable SRFE's. The use of local feedback calibration as opposed to global feedback calibration yields a 2½-bit improvement in a dual-slope converter topology at the same power consumption. Power, speed, and precision may be traded in the A/D to satisfy different performance specifications.

Those skilled in the art will appreciate that numerous modifications and variations may be made to the above disclosed embodiments without departing from the spirit and scope of the invention.

What is claimed is:

1. A logarithmic analog-to-digital converter system comprising:
   a transconductor for receiving an input signal and for producing a transconductor output signal at a transconductor output;
   a logarithmic circuit unit that contains a kT/q temperature variation that is cancelled by a q/kT variation of said transconductor;
   a comparator amplifier coupled to the output of said transconductor via a coupling capacitor for receiving said transconductor output signal and for producing a comparator amplifier output signal at a comparator amplifier output; and
   an integrating capacitor coupled to the transconductor output signal.

2. The logarithmic analog-to-digital converter system as claimed in claim 1, wherein said system further includes a de-integrating switch for selectively applying a de-integrating current to said transconductor output.

3. The logarithmic analog-to-digital converter system as claimed in claim 1, wherein said system further includes a first feedback loop coupling said transconductor output to an input of said transconductor, and a second feedback loop coupling said comparator amplifier output to an input of said comparator amplifier.

4. The logarithmic analog-to-digital converter system as claimed in claim 3, wherein said first feedback loop includes a first auto-zero switch and said second feedback loop includes a second auto-zero switch.

5. The logarithmic analog-to-digital converter system as claimed in claim 1 wherein said transconductor provides auto-zeroing.

6. The logarithmic analog-to-digital converter system as claimed in claim 1, wherein said comparator amplifier provides auto-zeroing.

7. The logarithmic analog-to-digital converter system as claimed in claim 1, wherein said transconductor employs a well-input transistor arrangement.

8. The logarithmic analog-to-digital converter system as claimed in claim 1, wherein said logarithmic circuit unit provides temperature compensation.

9. The logarithmic analog-to-digital converter system as claimed in claim 1, wherein said logarithmic circuit unit is coupled to an input of said transconductor.

10. The logarithmic analog-to-digital converter system as claimed in claim 1, wherein said transconductor employs a gate-input transistor arrangement.

11. The logarithmic analog-to-digital converter system as claimed in claim 1, wherein said system further includes a buffer amplifier coupled to said integrating capacitor.

12. A method of providing a logarithmic analog-to-digital conversion, said method comprising the steps of:
- receiving a transconductor input signal and producing a transconductor output signal at a transconductor output;
- coupling said transconductor output to an input of said transconductor;
- receiving said transconductor output signal at a comparator amplifier input and producing a comparator amplifier output signal at a comparator amplifier output that is coupled to the transconductor output via a coupling capacitor;
- coupling said comparator amplifier output to an input of said comparator amplifier;
- integrating the transconductor input signal for a first period of time; and
- de-integrating the transconductor output signal for a second period of time.

13. The method as claimed in claim 12, wherein said first period of time is fixed and said second period of time provides information representative of a digital output of said system.

14. The method as claimed in claim 12, wherein said method further includes the step of compensating for change in temperature of said system using a logarithmic circuit unit that is coupled to an input of the transconductor.

15. A logarithmic analog-to-digital converter system comprising:
- a transconductor for receiving an input signal and for producing a transconductor output signal at a transconductor output;
- a logarithmic circuit unit that is coupled to an input of said transconductor;
- a first feedback loop coupling said transconductor output to an input of said transconductor;
- a comparator amplifier coupled to the output of said transconductor via a coupling capacitor for receiving said transconductor output signal and for producing a comparator amplifier output signal at a comparator amplifier output;
- a second feedback loop coupling said comparator amplifier output to an input of said comparator amplifier; and
- an integrating capacitor coupled to the transconductor output signal.

16. The logarithmic analog-to-digital converter system as claimed in claim 15, wherein said system further includes a de-integrating switch for selectively applying a de-integrating current to the transconductor output.

17. The logarithmic analog-to-digital converter system as claimed in claim 15, wherein said first feedback loop includes a first auto-zero switch and said second feedback loop includes a second auto-zero switch.

18. The logarithmic analog-to-digital converter system as claimed in claim 15, wherein said logarithmic circuit unit provides temperature compensation.

19. The logarithmic analog-to-digital converter system as claimed in claim 15, wherein said logarithmic circuit unit is directly connected to an input of said transconductor.

20. The logarithmic analog-to-digital converter system as claimed in claim 19, wherein said logarithmic circuit unit contains a kT/q temperature variation that is cancelled by the q/kT variation of said transconductor.

21. A logarithmic analog-to-digital converter system comprising:
- a transconductor for receiving an input signal and for producing a transconductor output signal at a transconductor output;
- a first feedback loop coupling said transconductor output to an input of said transconductor;
- a comparator amplifier coupled to the output of said transconductor via a coupling capacitor for receiving said transconductor output signal and for producing a comparator amplifier output signal at a comparator amplifier output;
- a second feedback loop coupling said comparator amplifier output to an input of said comparator amplifier; and
- an integrating capacitor coupled to the transconductor output signal.

22. The logarithmic analog-to-digital converter system as claimed in claim 21, wherein said first feedback loop includes a first auto-zeroing switch.

23. The logarithmic analog-to-digital converter system as claimed in claim 21, wherein said system further includes a de-integrating switch for selectively applying a de-integrating current to the transconductor output.

24. The logarithmic analog-to-digital converter system as claimed in claim 21, wherein said system further includes a logarithmic circuit unit.

25. The logarithmic analog-to-digital converter system as claimed in claim 24, wherein said logarithmic circuit unit provides temperature compensation.

26. The logarithmic analog-to-digital converter system as claimed in claim 21, wherein said logarithmic circuit unit is coupled to an input of said transconductor.

27. The logarithmic analog-to-digital converter system as claimed in claim 26, wherein said logarithmic circuit unit contains a kT/q temperature variation that is cancelled by the q/kT variation of said transconductor.

28. The logarithmic analog-to-digital converter system as claimed in claim 21, wherein said second feedback loop includes a second auto-zeroing switch.

* * * * *